(12) United States Patent
Chan

(10) Patent No.: US 6,774,667 B1
(45) Date of Patent: Aug. 10, 2004

(54) METHOD AND APPARATUS FOR A FLEXIBLE CHARGEPUMP SCHEME FOR FIELD-PROGRAMMABLE GATE ARRAYS

(75) Inventor: Richard Chan, Los Altos, CA (US)

(73) Assignee: Actel Corporation, Mountain View, CA (US)

( * ) Notice: Subject to any disclaimer, the term of this patent is extended or adjusted under 35 U.S.C. 154(b) by 52 days.

(21) Appl. No.: 10/143,721

(22) Filed: May 9, 2002

(51) Int. Cl.[7] .............................................. G06F 7/38
(52) U.S. Cl. .............................. 326/37; 326/88; 326/92
(58) Field of Search .............................. 326/37–41, 47, 326/88, 92, 50, 56, 57; 327/535, 536

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 371/20 |
| 4,638,187 A | 1/1987 | Boler et al. | 307/451 |
| 4,638,243 A | 1/1987 | Chan | 324/51 |
| 4,684,830 A | 8/1987 | Tsui et al. | 307/465 |
| 4,700,130 A | 10/1987 | Bloemen | 324/110 |
| 4,706,216 A | 11/1987 | Carter | 365/94 |
| 4,713,557 A | 12/1987 | Carter | 307/242 |
| 4,717,912 A | 1/1988 | Harvey et al. | 340/825.83 |
| 4,718,042 A | 1/1988 | Moll et al. | 365/201 |
| 4,742,252 A | 5/1988 | Agrawal | 307/465 |
| 4,772,812 A | 9/1988 | Desmarais | 307/473 |
| 4,800,176 A | 1/1989 | Kakumu et al. | 437/193 |
| 4,857,774 A | 8/1989 | El-Ayat et al. | 307/465 |
| 4,870,300 A | 9/1989 | Nakaya et al. | 307/303 |
| 4,870,302 A | 9/1989 | Freeman | 307/465 |
| 4,873,459 A | 10/1989 | El Gamal et al. | 307/465 |
| 4,928,023 A | 5/1990 | Marshall | 307/443 |
| 4,930,097 A | 5/1990 | Ledenbach et al. | 364/716 |
| 4,935,645 A | 6/1990 | Lee | 307/362 |
| 4,959,561 A | 9/1990 | McDermott et al. | 307/443 |
| 4,978,905 A | 12/1990 | Hoff et al. | 323/314 |
| 5,008,855 A | 4/1991 | Eltoukhy et al. | 365/96 |
| 5,021,680 A * | 6/1991 | Zaw Win et al. | 307/243 |
| 5,046,035 A | 9/1991 | Jigour et al. | 364/716 |
| 5,083,083 A | 1/1992 | El-Ayat et al. | 324/158 R |
| 5,121,394 A | 6/1992 | Russell | 371/22.1 |
| 5,122,685 A | 6/1992 | Chan et al. | 307/465.1 |
| 5,126,282 A | 6/1992 | Chiang et al. | 437/172 |

(List continued on next page.)

FOREIGN PATENT DOCUMENTS

| | | | |
|---|---|---|---|
| EP | 0 415 542 A2 | 3/1991 | H03K/19/173 |
| EP | 0 415 542 A3 | 10/1991 | H03K/19/173 |
| EP | 0 889 593 A1 | 1/1999 | H03K/19/173 |
| EP | 1 137 188 A2 | 9/2001 | H03L/7/08 |

OTHER PUBLICATIONS

US 6,564,273, 5/2003, Plants (withdrawn)
Fran Lien, inventor, "Tileable Field–Programmable Gate Array Architecture", 22 pp. Specification, 4 pp. Claims, 1 p. Abstract, 20 Drawing Sheets, 09/654,240 filed Sep. 20, 2000.
L. Ashby, "ASIC Clock Distribution using a Phase Locked Loop (PLL)", *Proceedings Fourth Annual IEEE International ASIC Conference and Exhibit*, pp. 6.1–6.3, Sep. 1991.
"AV9170 Clock Synchronizer and Multiplier", pp. 1–4, 8, Nov. 1992.

(List continued on next page.)

*Primary Examiner*—Anh Q. Tran
(74) *Attorney, Agent, or Firm*—Sierra Patent Group, Ltd.

(57) ABSTRACT

A programmable gate array comprising: a plurality of logic modules, each logic module having at least one output coupled to an isolation transistor, each isolation transistor in each of the plurality of logic modules having a gate; and a charge pump having a pump-voltage output line coupled to the gates of each isolation transistor in each of the plurality of logic modules. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims, 37 CFR 1.72(b).

6 Claims, 12 Drawing Sheets

U.S. PATENT DOCUMENTS

| | | | |
|---|---|---|---|
| 5,132,571 A | 7/1992 | McCollum et al. | 307/465.1 |
| 5,144,166 A | 9/1992 | Camarota et al. | 307/465.1 |
| 5,187,392 A | 2/1993 | Allen | 307/465 |
| 5,198,705 A | 3/1993 | Galbraith et al. | 307/465 |
| 5,208,491 A | 5/1993 | Ebeling et al. | 307/465 |
| 5,220,213 A | 6/1993 | Chan et al. | 307/465 |
| 5,220,215 A | 6/1993 | Douglas et al. | 307/465 |
| 5,221,865 A | 6/1993 | Phillips et al. | 307/465 |
| 5,222,066 A | 6/1993 | Grula et al. | 371/21.1 |
| 5,258,319 A | 11/1993 | Inuishi et al. | 437/35 |
| 5,272,388 A | 12/1993 | Bakker | 307/202.1 |
| 5,286,922 A | 2/1994 | Curtiss | 174/112 |
| 5,293,133 A | 3/1994 | Birkner et al. | 324/713 |
| 5,300,830 A | 4/1994 | Hawes | 307/465 |
| 5,300,832 A | 4/1994 | Rogers | 307/475 |
| 5,317,698 A | 5/1994 | Chan | 395/325 |
| 5,365,485 A | 11/1994 | Ward et al. | 365/221 |
| 5,367,207 A | 11/1994 | Goetting et al. | 307/465 |
| 5,375,089 A | 12/1994 | Lo | 365/189.04 |
| 5,394,033 A | 2/1995 | Tsui et al. | 326/41 |
| 5,394,034 A | 2/1995 | Becker et al. | 326/39 |
| 5,396,128 A | 3/1995 | Dunning et al. | 326/68 |
| 5,397,939 A | 3/1995 | Gordon et al. | 326/38 |
| 5,399,920 A | 3/1995 | Van Tran | 326/83 |
| 5,400,262 A | 3/1995 | Mohsen | 364/489 |
| 5,430,335 A | 7/1995 | Tanoi | 327/170 |
| 5,430,687 A | 7/1995 | Hung et al. | 365/230.08 |
| 5,469,003 A | 11/1995 | Kean | 326/39 |
| 5,469,396 A | 11/1995 | Eltoukhy | 365/210 |
| 5,473,268 A | 12/1995 | Declercq et al. | 326/80 |
| 5,485,103 A | 1/1996 | Pedersen et al. | 326/41 |
| 5,486,775 A | 1/1996 | Veenstra | 126/38 |
| 5,526,312 A | 6/1996 | Eltoukhy | 365/201 |
| 5,537,057 A | 7/1996 | Leong et al. | 326/41 |
| 5,546,019 A | 8/1996 | Liao | 326/81 |
| 5,559,464 A | 9/1996 | Orii et al. | 327/333 |
| 5,572,476 A | 11/1996 | Eltoukhy | 365/210 |
| 5,666,322 A | 9/1997 | Conkle | 365/233 |
| 5,670,905 A | 9/1997 | Keeth et al. | 327/333 |
| 5,744,979 A | 4/1998 | Goetting | 326/39 |
| 5,744,980 A | 4/1998 | McGowan et al. | 326/40 |
| 5,801,547 A | 9/1998 | Kean | 326/40 |
| 5,809,281 A | 9/1998 | Steele et al. | 395/497.01 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,832,892 A | 11/1998 | Yaoita | 123/260 |
| 5,835,165 A | 11/1998 | Keate et al. | 348/845.1 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,848,006 A | 12/1998 | Nagata | 365/230.06 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,852,608 A | 12/1998 | Csoppenszky et al. | 370/465 |
| 5,854,763 A | 12/1998 | Gillingham et al. | 365/189.04 |
| 5,859,542 A | 1/1999 | Pedersen | 326/39 |
| 5,859,543 A | 1/1999 | Kolze | 326/41 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,586 A | 2/1999 | Baxter | 395/500 |
| 5,880,492 A | 3/1999 | Duong et al. | 257/209 |
| 5,880,512 A | 3/1999 | Gordon et al. | 257/530 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,949,719 A | 9/1999 | Clinton et al. | 365/189.01 |
| 5,952,847 A | 9/1999 | Plants et al. | 326/80 |
| 5,994,934 A | 11/1999 | Yoshimura et al. | 327/158 |
| 6,011,744 A | 1/2000 | Sample et al. | 365/230.03 |
| 6,034,677 A | 3/2000 | Noguchi et al. | 345/327 |
| 6,038,627 A | 3/2000 | Plants | 710/126 |
| 6,049,487 A | 4/2000 | Plants et al. | 365/189.04 |
| 6,111,448 A | 8/2000 | Shibayama | 327/293 |
| 6,121,795 A * | 9/2000 | Curd et al. | 326/83 |
| 6,181,174 B1 | 1/2001 | Fujieda et al. | 327/158 |
| 6,289,068 B1 | 9/2001 | Hassoun et al. | 375/376 |
| 6,292,016 B1 | 9/2001 | Jefferson et al. | 326/39 |
| 6,329,839 B1 | 12/2001 | Pani et al. | 326/41 |
| 6,430,088 B1 | 8/2002 | Plants et al. | 365/189.04 |
| 6,437,650 B1 | 8/2002 | Sung et al. | 331/25 |
| 6,496,887 B1 | 12/2002 | Plants | 710/100 |
| 6,577,161 B2 * | 6/2003 | Sun et al. | 326/49 |

OTHER PUBLICATIONS

"AV9170 Application Note", AvaSem, pp. 1–7, Jan. 1993.

U. Ko, "A 30–ps JITTER, 3.6–µs Locking, 3.3–Volt digital PLL for CMOS Gate Arrays", *IEEE 1993 Custom Integrated Circuits Conference*, pp. 23.3.1–23.3.4, Conf. Date: May 9–12, 1993.

A. Efendovich et al., "Multi–Frequency Zero–Jitter Delay–Locked Loop", *IEEE 1993 Custom Integrated Circuits Conference*, pp. 27.1.1–27.1.4, Conf. Date: May 9–12, 1993.

R. Quinnell, "Blending gate arrays with dedicated circuits sweetens ASIC development", EDN, pp. 29–32, Mar. 31, 1994.

J. Chen, "PLL–based clock systems span the system spectrum from green PCs to Alpha", EDN, pp. 147–148, 150, 152, 154–155, Nov. 9, 1995.

P. Sevalia, "Straightforward techniques cut jitter in PLL–based clock drivers", EDN, pp. 119–123, 125, Nov. 23, 1995.

D. Bursky, "Memories Hit New Highs And Clocks Run Jitter–Free", Electronic Design, pp. 79–80, 84–85, 89–93, Feb. 19, 1996.

* cited by examiner

| CPEN | PMGND | OUT |
|---|---|---|
| 0 | 0 | floating |
| 0 | 1 | 0V |
| 1 | X | pump voltage |

FIG. 7

| Control Signals | | | Actions | | | Bond Pad | Output | Comments |
|---|---|---|---|---|---|---|---|---|
| CPEN2 | CPEN1 | PMPGND1 | CP2 | Q1 | CP1 | VPUMP | PMPOUT | |
| 0 | 0 | 0 | 0V | ON | disabled | Vx | = VPUMP voltage | VPUMP Mode. |
| 1 | 1 | X | enabled | OFF | enabled | 0 | = CP1 voltage | ChargePump Mode. |
| 0 | 0 | 1 | 0V | ON | 0V | READ | = 0V from CP1 | ChargePump Measurement Mode. |
| 0 | 1 | X | 0V | ON | enabled | READ | = CP1 voltage | Can measure PMPOUT voltage at VPUMP bond pad. |
| 1 | 0 | 0 | enabled | OFF | disabled | X | = floating | PMPOUT Floating Mode |
| 1 | 0 | 1 | enabled | OFF | 0V | X | = 0V from CP1 | PMPOUT Grounding Mode |

FIG. 9

| Control Signals | | | | Actions | | | Bond Pad | Output | Comments |
|---|---|---|---|---|---|---|---|---|---|
| TEST | CPEN2 | CPEN1 | PMPGND1 | CP2 | Q1 | CP1 | VPUMP | PMPOUT | |
| 0 | X | X | X | 0V | ON | disabled | Vx | = VPUMP voltage | VPUMP Mode. |
| 0 | X | X | X | enabled | OFF | enabled | 0 | = CP1 voltage | ChargePump Mode. |
| 1 | 0 | 0 | 1 | 0V | ON | 0V | READ | = 0V from CP1 | ChargePump Measurement Mode. |
| 1 | 0 | 1 | X | 0V | ON | enabled | READ | = CP1 voltage | Can measure PMPOUT voltage at VPUMP bond pad. |
| 1 | 1 | 0 | 0 | enabled | OFF | disabled | X | = floating | PMPOUT Floating Mode (testing) |
| 1 | 1 | 0 | 1 | enabled | OFF | 0V | X | = 0V from CP1 | PMPOUT Grounding Mode (programming, testing) |

FIG. 11

METHOD AND APPARATUS FOR A FLEXIBLE CHARGEPUMP SCHEME FOR FIELD-PROGRAMMABLE GATE ARRAYS

BACKGROUND OF THE DISCLOSED SYSTEM

1. Field of the Disclosed System

The present disclosed system relates to field-programmable gate arrays ("FPGAs"), and more particularly, to a method and apparatus for flexibly chargepumping elements of an FPGA.

2. Description of the Related Art

An FPGA is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two or more flip-flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M-M antifuse, SRAM memory cell Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory CM determines the cells' functions and their interconnection wiring. Each bit of CM controls a transistor switch in the target circuit that can select some cell function or make (or break) some connection. By replacing the contents of CM, designers can make design changes or correct design errors.

The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream i.e., a stream of ones and zeros, that is fed into the FPGA and used to program the configuration memories for the programmable switches or program the shift registers for anti-fuse type switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

When an FPGA that has been programmed to perform one specific function is compared to an application specific integrated circuit (ASIC) that has been designed and manufactured to perform that same specific function, the FPGA will necessarily be a larger device than the ASIC. This is because FPGAs are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC which makes the ASIC a smaller device. An ASIC, on the other hand, is not a flexible device. In other words, once an ASIC has been designed and manufactured it cannot be reconfigured to perform a different function like is possible with an FPGA.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip (SOC) that includes the embedded FPGA as well as several other components. The several other components may include, for example, a microprocessor, memory, arithmetic logic unit (ALU), state machine, etc. In this scenario the embedded FPGA may be only a small part of the whole SOC.

Whether an FPGA is to be manufactured as its own IC or embedded into a larger IC (e.g., an SOC), the intended application/use of the IC will determine the size and complexity of the FPGA that is needed. In some scenarios a large FPGA is needed, and in other scenarios a small FPGA is needed. Because FPGAs are often designed for a specific user's intended application/use, an FPGA designed to fulfill a need for a small FPGA must be substantially redesigned for use where a larger FPGA is needed. Different FPGA users have different design criteria. Under some circumstances, a higher internal supply voltage (such as but not limited to: 5V, 6V, 10V) may be required for the proper operation of a particular FPGA design, which may be higher than what is usually supplied from the normal, external power supply ($V_{DD}$) (such as but not limited to: 2.5V, 3.3V). Thus, it would be advantageous for an FPGA to have a user programmable option for an internal supply voltage in addition to the typical supply voltage ($V_{DD}$) that is supplied to an FPGA.

BRIEF SUMMARY OF THE DISCLOSED SYSTEM

The disclosed system relates to a field programmable gate array comprising: a plurality of logic modules, each logic module having at least one output coupled to an isolation transistor, each isolation transistor in each of the plurality of logic modules having a gate; and a charge pump having a pump-voltage output line coupled to the gates of each isolation transistor in each of the plurality of logic modules.

A better understanding of the features and advantages of the present disclosed system will be obtained by reference to the following detailed description of the disclosed system and accompanying drawings which set forth an illustrative embodiment in which the principles of the disclosed system are utilized.

BRIEF DESCRIPTION OF THE DRAWINGS

FIG. 7 is a truth table representing the embodiment of FIG. 6.

FIG. 9 is a truth table representing the embodiment of FIG. 8.

FIG. 11 is a truth table representing the embodiment of FIG. 10.

DETAILED DESCRIPTION OF THE DISCLOSED SYSTEM

Figure 1:
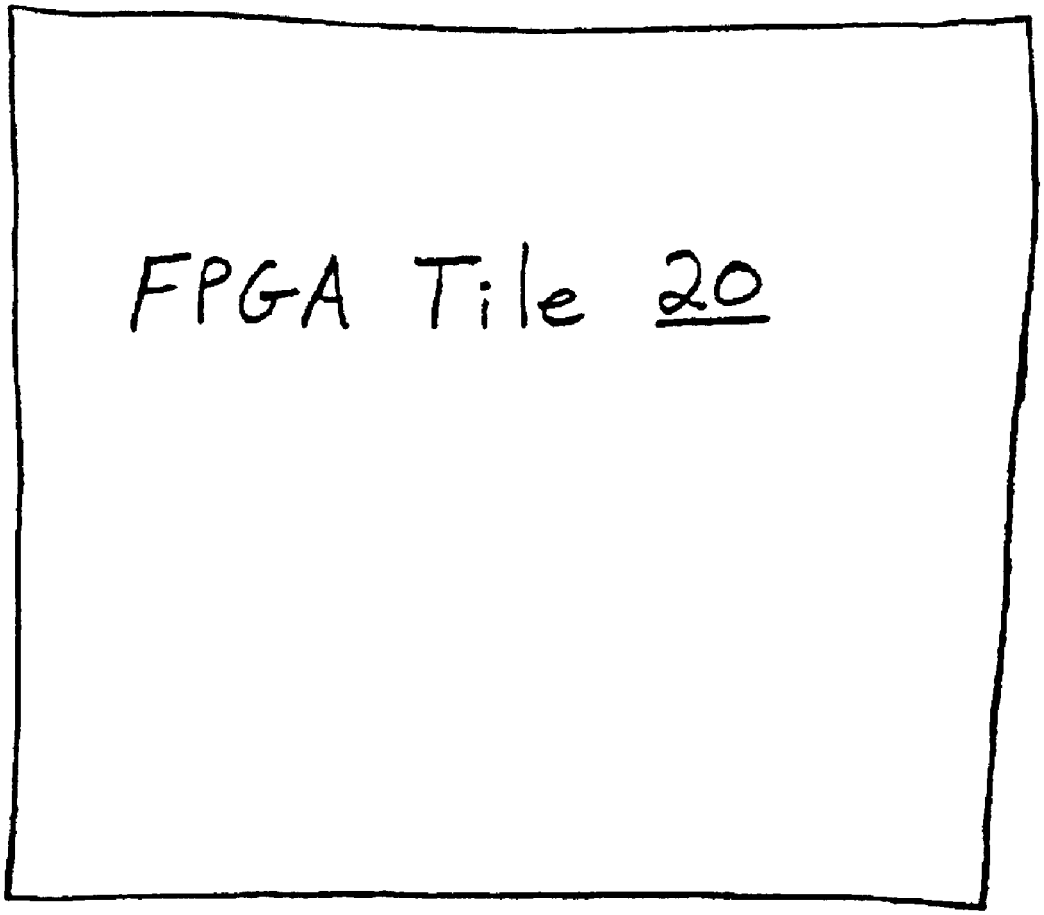
FIG. 1 is an example block diagram illustrating an FPGA tile in accordance with the present disclosed system.

Referring to FIG. 1, there is illustrated a field-programmable gate array (FPGA) tile 20 in accordance with the present disclosed system. The FPGA tile 20 overcomes many of the disadvantages of conventional FPGAs in that it can be easily adapted for use in both integrated circuits (ICs) requiring large FPGAs and ICs requiring small FPGAs. Furthermore, the FPGA tile 20 can be used where the FPGA is to be manufactured as its own IC and where the FPGA is to be embedded into a larger IC (e.g., a system on a chip (SOC)).

Figure 2:
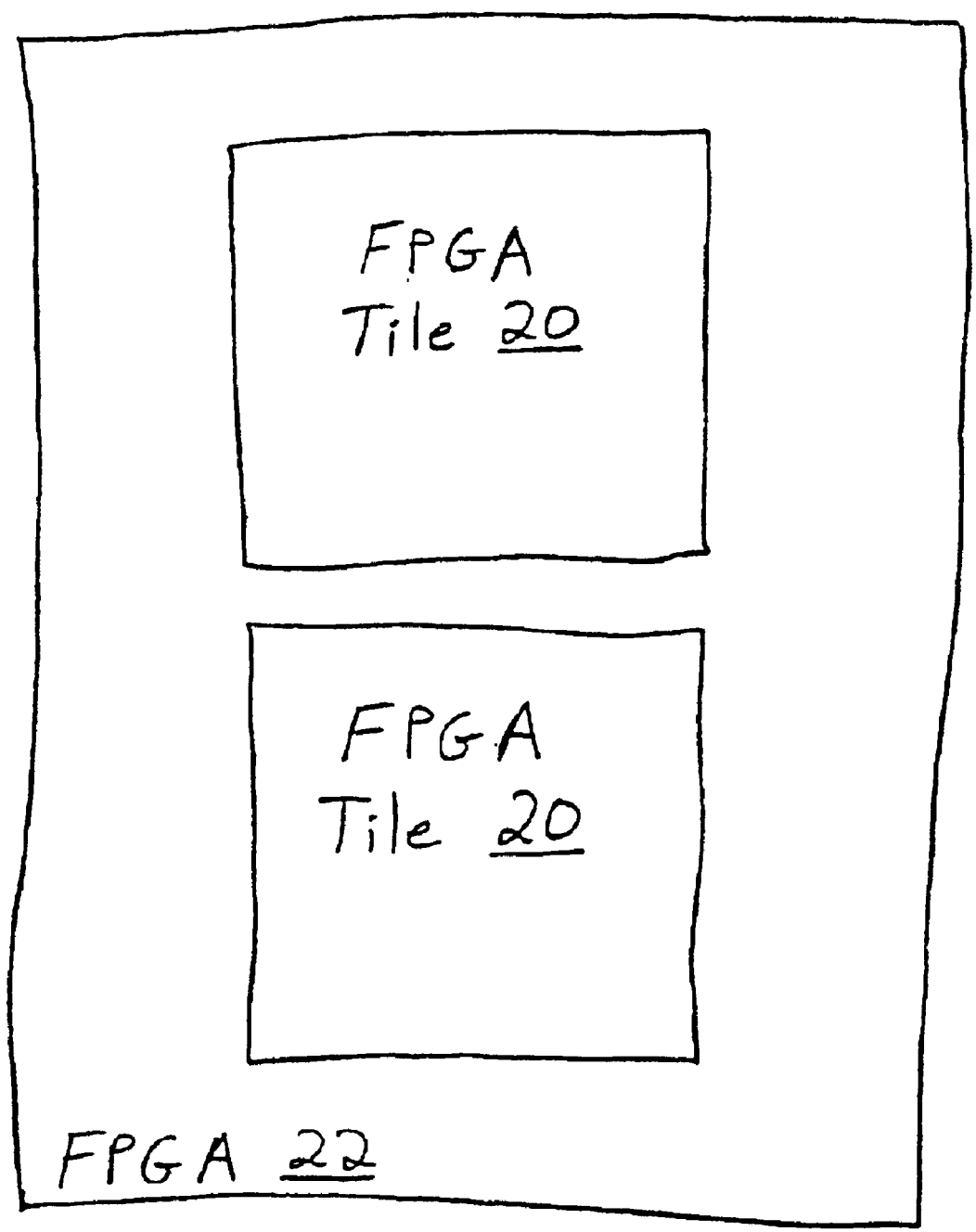
FIGS. 2, 3A, 3B and 4 are examples block diagrams illustrating various configurations of FPGA tiles in accordance with the present disclosed system.
Figure 3A:
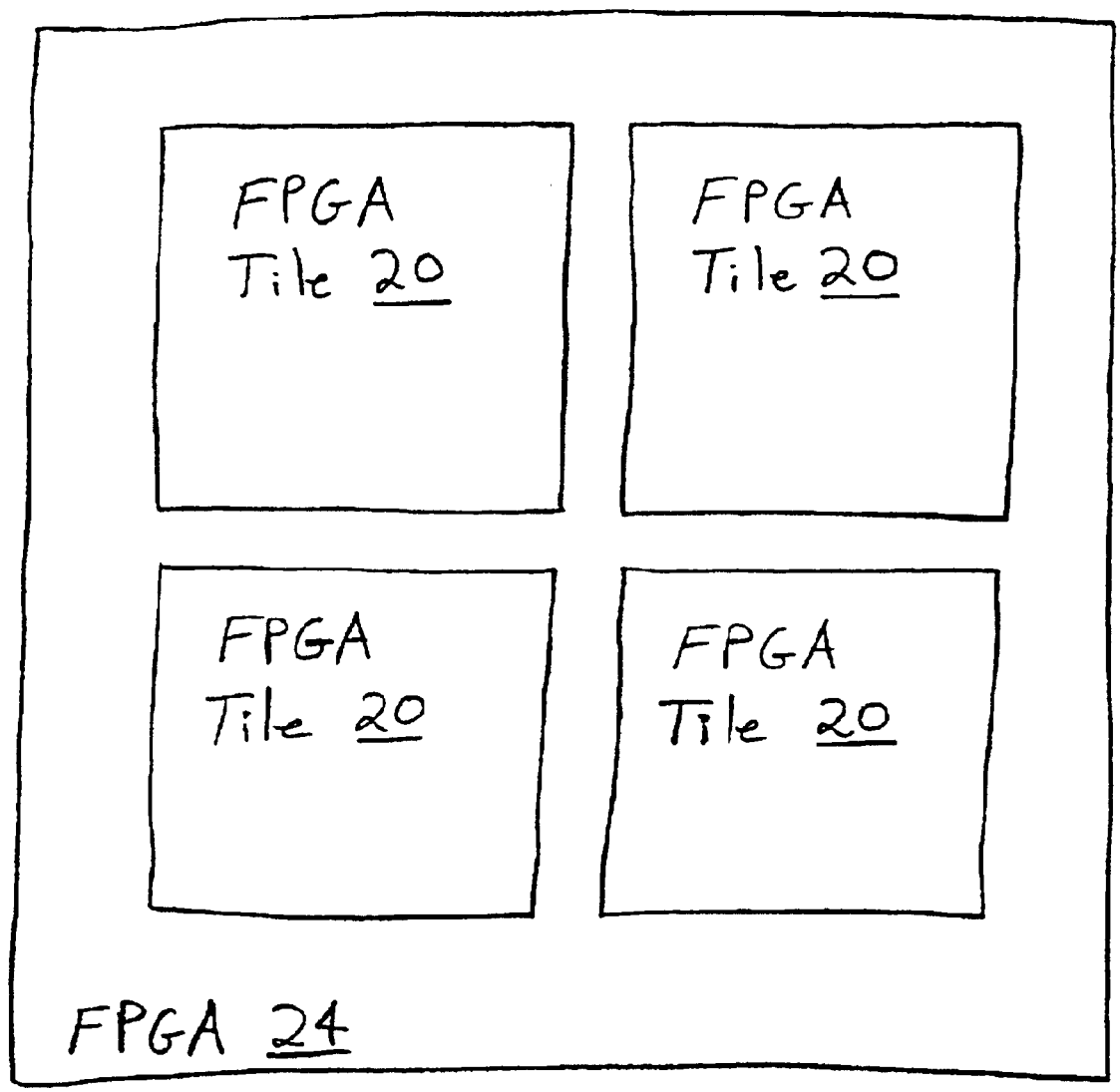

One feature of the FPGA tile 20 that makes it such a flexible and adaptable device is that it is "tileable". As used herein, the term "tileable" means that the FPGA tile 20 can be combined with other FPGA tiles to form a larger FPGA. For example, FIG. 2 illustrates an FPGA 22 that is formed by combining two FPGA tiles 20. The two FPGA tiles 20 work together and communicate with each other to form the larger FPGA 22. It should be well understood that any number of FPGA tiles 20 may be combined in accordance with the present disclosed system to form a larger FPGA. For example, FIG. 3A illustrates an FPGA 24 that is formed by combining four FPGA tiles 20.

Figure 3B:
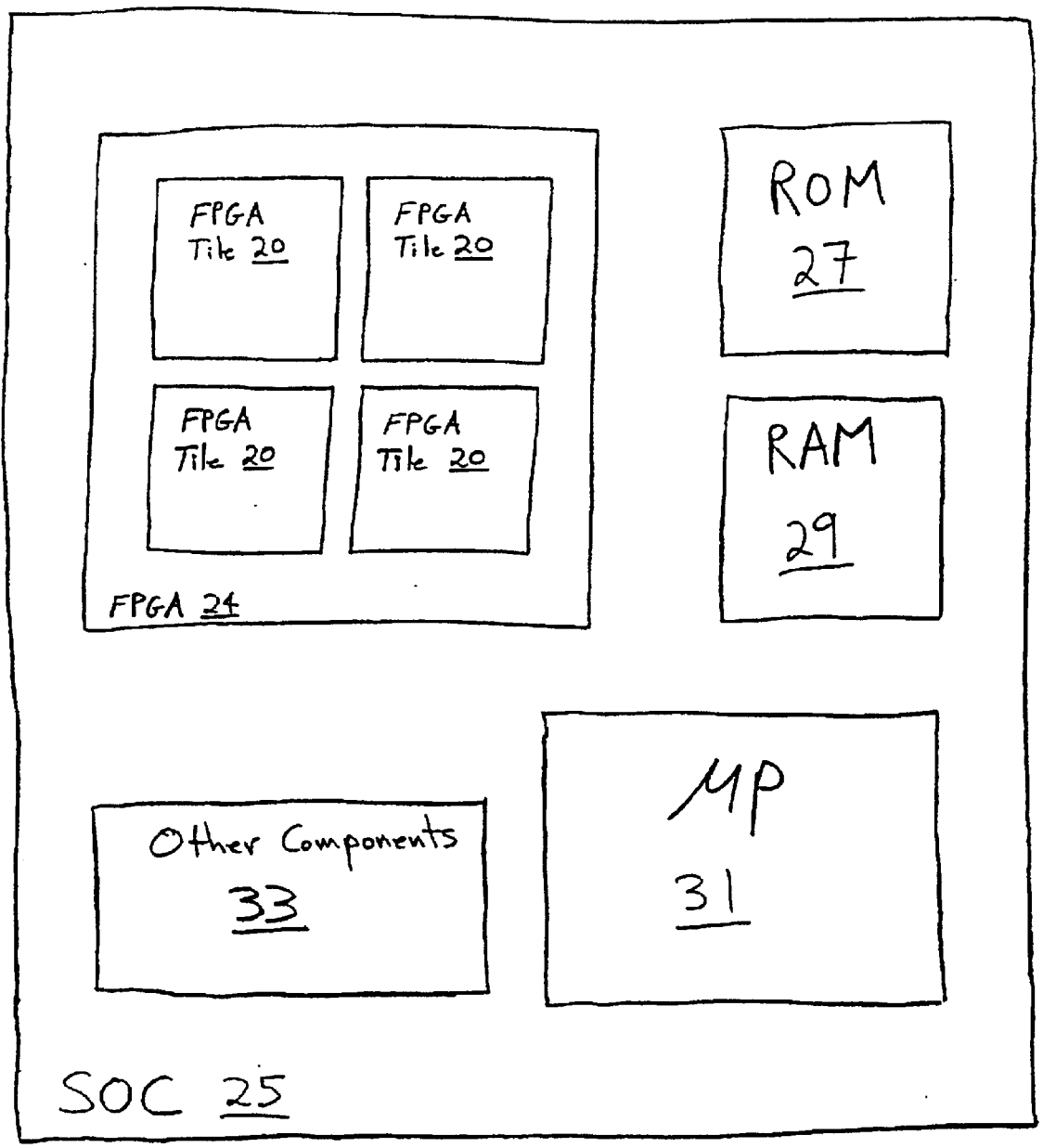
Figure 4:
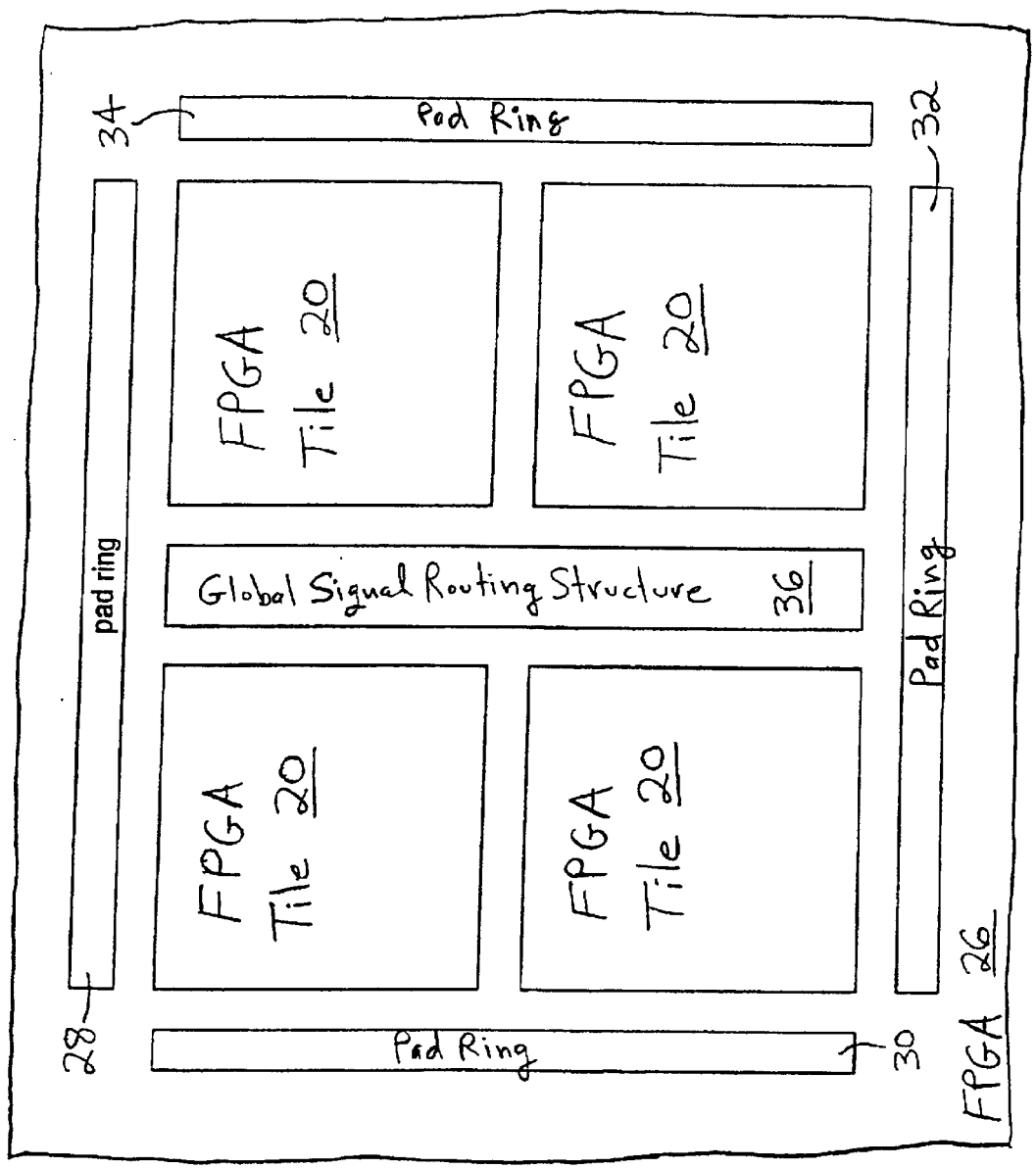

In accordance with the present disclosed system, FPGA tiles 20 may be combined to form a larger FPGA that is to be manufactured as its own IC or that is to be embedded into a larger IC. For example, with respect to the later scenario, the FPGAs 22, 24 may be embedded into SOCs. FIG. 3B shows an SOC 25 having the FPGA 24 embedded therein. The SOC 25 includes several other components. The other components may include, for example, a read only memory (ROM) 27, a random access memory (RAM) 29, a microprocessor 31, and any other components 33. It should be well understood that the specific types of other components and the number of other components included on the SOC 25 will vary greatly depending on the particular application. With respect to the former scenario, FIG. 4 illustrates an FPGA 26 that has been manufactured as its own IC. Specifically, the FPGA 26 includes four FPGA tiles 20 and four pad rings 28, 30, 32, 34. The pad rings 28, 30, 32, 34 are used to couple the FPGA tiles 20 to the IC package pins of the FPGA 26.

Also illustrated in FIG. 4 is a global signal routing structure 36. The global signal routing structure 36 is generally used to route inter-tile global signals between the FPGA tiles 20. It should be understood that the global signal routing structure 36 may be included in any combination of FPGA tiles 20, including for example the FPGAs 22, 24, in accordance with the present disclosed system. Furthermore, the global signal routing structure 36 may be used whether the combined FPGA tiles 20 are manufactured as their own IC or embedded into a larger IC.

The FPGA tiles that are combined may be identical (as are the tiles in the FPGAs 22, 24, 26), or of different sizes and designs in accordance with the present disclosed system. An advantage of using identical FPGA tiles is that it provides an economical solution for providing FPGAs having sizes that are appropriate for the intended uses/applications. Such a solution is economical because only one FPGA tile needs to be designed, and then the necessary number of tiles are combined to form an FPGA. Additionally, it should be understood that an "FPGA tile" is considered herein to be an FPGA. In other words, a single FPGA tile 20 can be used by itself to form an FPGA.

In FPGA circuit designs, an internal chargepump circuit may be used to generate a higher internal supply voltage (such as but not limited to: 5V, 6V, 10V) than what is supplied from the normal, external power supply ($V_{DD}$) power supply (such as but not limited to: 2.5V, 3.3V) for various circuit design operations. A chargepump circuit is an internal circuit for generating voltage higher than that to be supplied from the system side in the semiconductor chip. These higher internal supply voltages, which may be carried on a line referred to as "PMPOUT", may be used for powering special internal circuits in normal FPGA chip operation, for providing programming and/or biasing voltages in chip programming (such as but not limited to: ISP in Flash-based FPGAs), and/or for testing purposes.

Figure 5:
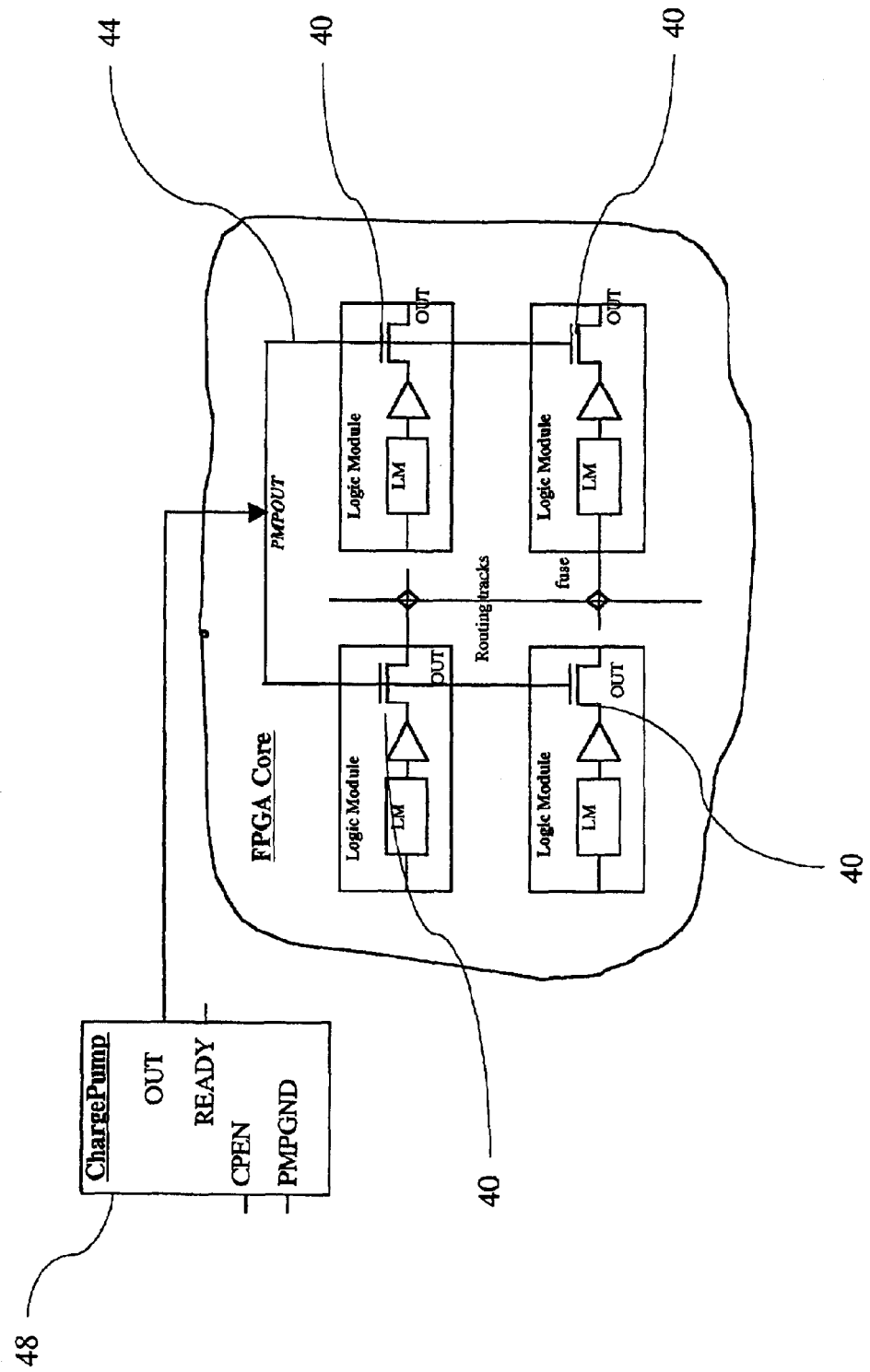
FIG. 5 is a simplified schematic illustrating one embodiment of the disclosed chargepump FPGA.

FIG. 5 is a conceptual drawing of one embodiment of a system comprising a chargepump in an antifuse-based FPGA. The FPGA core is an array of m rows by n columns of logic modules ("LMs"). A 2×2 array of LMs is shown in FIG. 5. The logic modules are user configurable logic components, that is each LM can be configured to NAND, NOR, FF and many other logic functions. Horizontal and vertical routing tracks with programmable interconnecting elements, such as antifuse elements, are included in the FPGA Core for LM interconnections. The programmable interconnectors are placed between horizontal and vertical routing tracks in the FPGA. Programmable interconnectors are normally in an "open" state, that is a non-conductive high impedance state. Programmable interconnectors may be selectively programmed to a "short" state which is a conductive low impedance state, to connect two routing tracks by applying high programming voltages across the programmable interconnector through the routing tracks.

Due to the high programming voltage applied to the routing tracks during programmable interconnector programming, isolating the LM output from high voltage break down may be necessary. This isolation may be accomplished by using a high voltage NMOS transistor 40 as an isolation transistor whose gate is controlled by a PMPOUT line 44 which is coupled to the chargepump 48. It will be apparent to persons of ordinary skill in the art that the component 40 is not necessarily limited to NMOS type transistors, other component types such as PMOS, Bipolar NPN, PNP, JFET, may be used. During programming, PMPOUT is forced to a ground condition thereby turning off all of the LM's output isolation transistors 40. In normal chip operation, the internal chargepump "pumps" the PMPOUT to a high voltage level which is higher than the $V_{DD}$ supply voltage such that all logic module output isolation transistors will be in a "ON" status and the full $V_{DD}$ voltage swing can be passed from one LM output to another LM's input.

Figure 6:
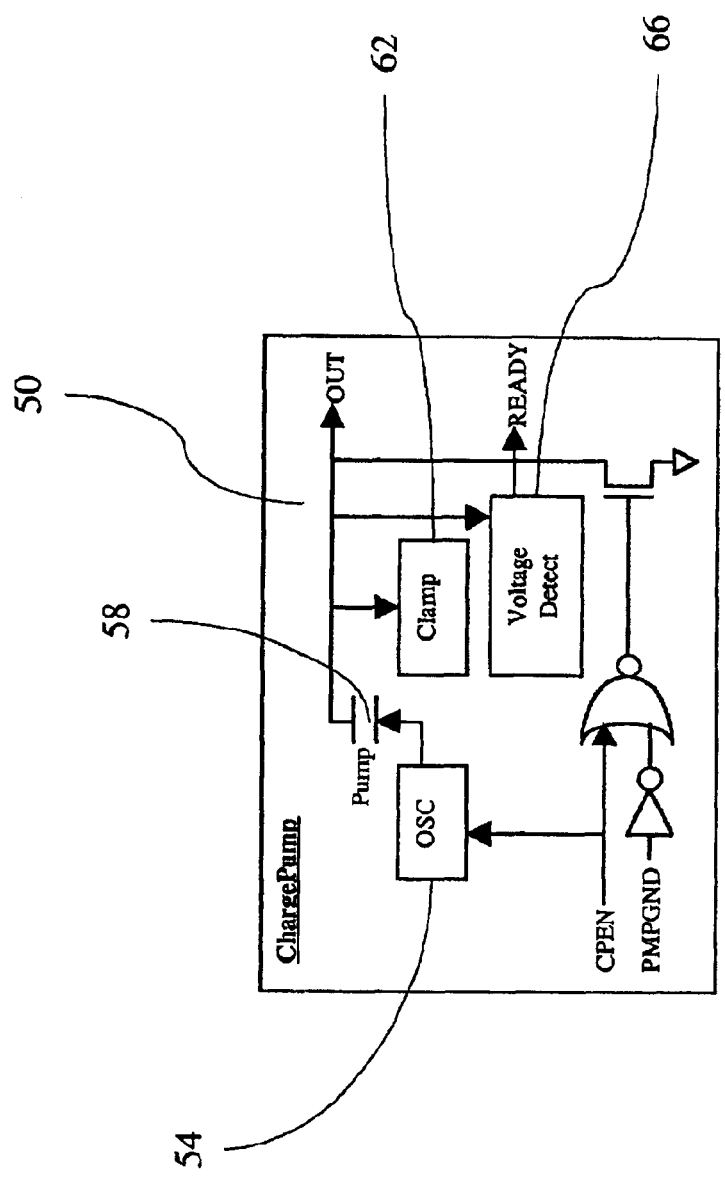
FIG. 6 is a more detailed schematic illustrating one embodiment of the disclosed chargepump.

FIG. 6 shows one embodiment of a design for the chargepump circuit 50. The ring oscillator ("OSC") 54 and the pump capacitor 58 form the basic chargepump unit. Essentially, as the OSC is oscillating, the output line OUT will be gradually bootstrapped to a higher and higher voltage level. The clamp circuit 62 limits the maximum "OUT" voltage level and a voltage detect circuit 66 may be included to sense the OUT voltage level. Once the proper voltage level is sensed by the voltage detect circuit 66, the circuit 66 issues a READY signal on the READY line. Once a READY signal is issued, normal chip operation begins. Normal chip operation is non-testing, non-programming operation of the chip. CPEN is an input line to the chargepump that enables or disables the chargepump. Together with the CPEN line, the pump-voltage-output-grounding input ("PMPGND") line is another input line that controls the "OUT" voltage level, such that the OUT line may have 3 states: floating, 0V, and Pump Voltage as listed in the truth table in FIG. 7. FIG. 7 shows a truth table for the disclosed system set forth in FIG. 6. Fault free systems will produce the output values according to the truth table set forth in FIG. 7.

In another embodiment of the disclosed system, during programming of the FPGA, the chargepump maybe disabled with the OUT line forced to 0 V by sending a signal to the PMPGND input of the chargepump. In production testing of chip, the chargepump can be enabled or disabled with the OUT line set to floating state, 0 V, or to the pump voltage. In normal chip operation, the chargepump is always enabled with OUT set at the Pump voltage.

A chargepump in the FPGA chip may be desirable for some of the following non-limiting reasons: the chargepump may be designed to generate any voltage level required; the chargepump may eliminate the need of an additional external power supply voltage in a printed circuit board containing the FPGA.

In general, FPGAs serve many application areas, such as but not limited to: e-appliance, consumer applications, commercial, aviation, space, military, etc. Different FPGA users have different design criteria. Thus, it is advantageous for an FPGA chip to have a flexible chargepump architecture that may accommodate different users' choices. For example, an FPGA user may prefer to use the internal chargepump because no additional power supply is available in the circuit board/system. On the other hand, another FPGA user may not want to use the internal chargepump in an aviation application design, for example, and he is willing to and can accommodate an additional supply to power the FPGA chip for operation reliability in a radiation environment, for instance. Thus, the user has the option to choose whether to employ the internal chargepump or not, depending on his requirements. The user chooses whether to activate or deactivate the chargepump when he programs the FPGA, for example, by programming or not programming selected programmable switches that either connect the chargepump circuit to the other components of the device or isolate it from the other components.

Another embodiment of the disclosed system has a flexible chargepump architecture that may be implemented in an FPGA chip such that the FPGA chip may be operated with either an internal chargepump or an external power supply at the FPGA user's choice.

Figure 8:
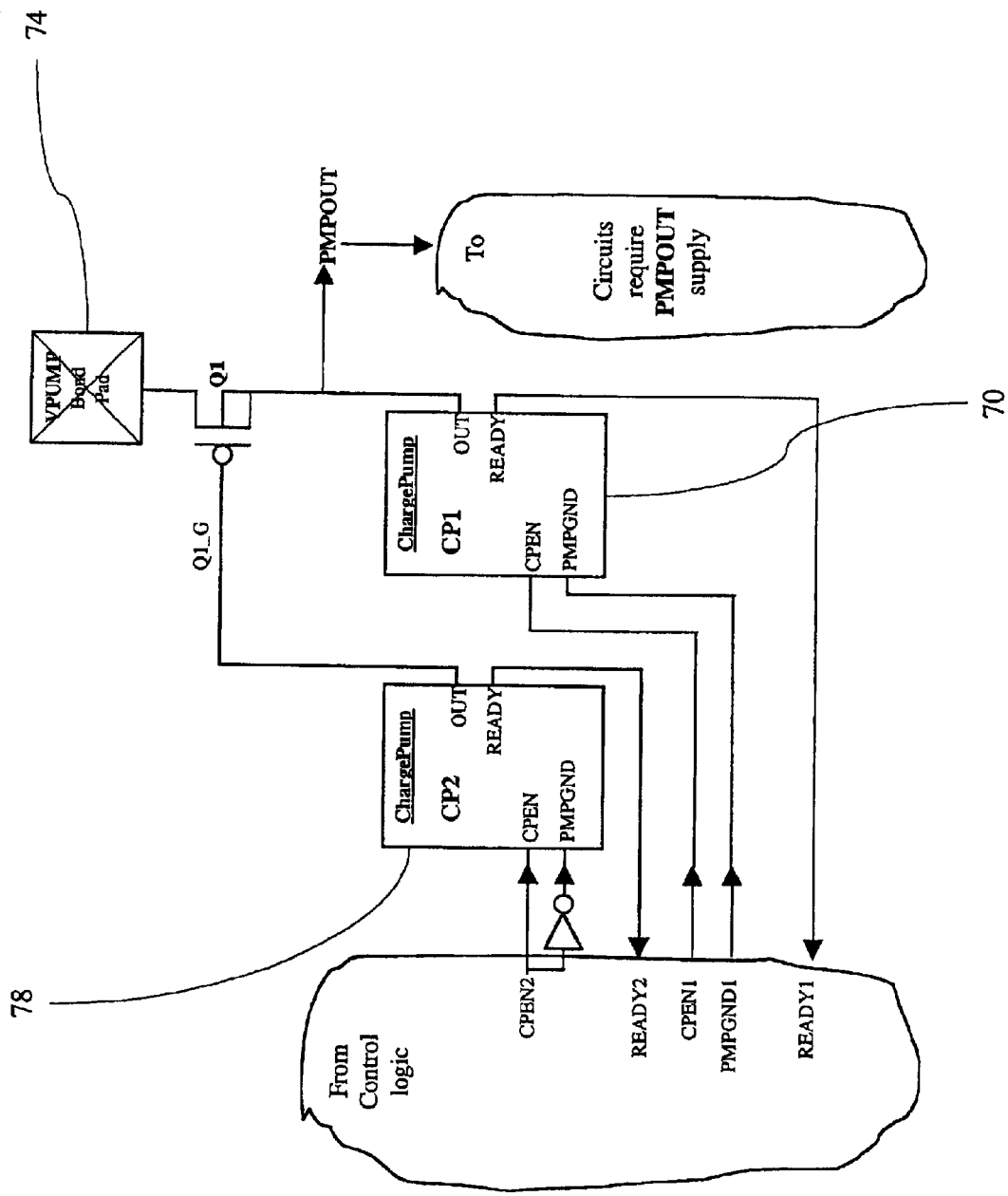
FIG. 8 is a simplified schematic illustrating another embodiment of the disclosed chargepump system.

FIG. 8 shows another embodiment of a disclosed flexible chargepump architecture. Line PMPOUT is an internal power supply bus that can be powered by either the internal chargepump ("CP1") 70 or externally by a voltage placed on an I/O pad ("VPUMP") 74 of the integrated circuit. If CP1 is enabled, that is line signal CPEN1=1 and line signal PMPGND1=0, and the PMOS pad switch (Q1) is "OFF" (CPEN2=1 thus Q1_G=1), the PMPOUT bus will be powered by the internal chargepump CP1. If CP1 is disabled (i.e. CPEN1=0, PMPGND1=0) and the PMOS pad switch (Q1) is "ON" (i.e. CPEN2=0 therefore Q1_G=0), the PMPOUT bus could be powered by an external power supply through the VPUMP bond pad.

When the internal chargepump (CP1) is used, the PMOS pad switch, designated as Q1 in FIG. 8, needs to be shut off properly such that there is no leakage from PMPOUT to VPUMP degrading the PMPOUT voltage. To turn Q1 "OFF" properly, the voltage applied to Q1_G needs to be greater than the voltages of PMPOUT and VPUMP combined. Therefore a voltage source such as a second chargepump "CP2" 78 may be used to control the "Gate" of Q1. Also, Q1 may be designed with its "Body" (n-well) tied to PMPOUT because the PMPOUT voltage is greater than that of VPUMP in the chargepump Mode.

FIG. 9 shows a truth table illustrating the various modes of operation of the chargepump embodiment shown in FIG. 8. Fault free systems will produce the output values according to the truth table set forth in FIG. 9.

These modes of operation can be implemented for normal chip operation, programming, and testing. In one embodiment, the flexible chargepump architecture input signals CPEN1, PMPGND1, CPEN2 may be controlled by the following non-limiting components: chip control logic, JTAG control logic, field-programmable fuse elements such as antifuse, FLASH, SRAM, or a combination of control logic, and programmable elements. In one non-limiting example, the FPGA chip may be designed to have the chargepump as a default setting and an antifuse may be programmed to change the chip to have the VPUMP setting.

Furthermore, Q1 is not limited to PMOS type transistors, other component types such as NMOS, Bipolar NPN, PNP, JFET, may be used.

Figure 10:
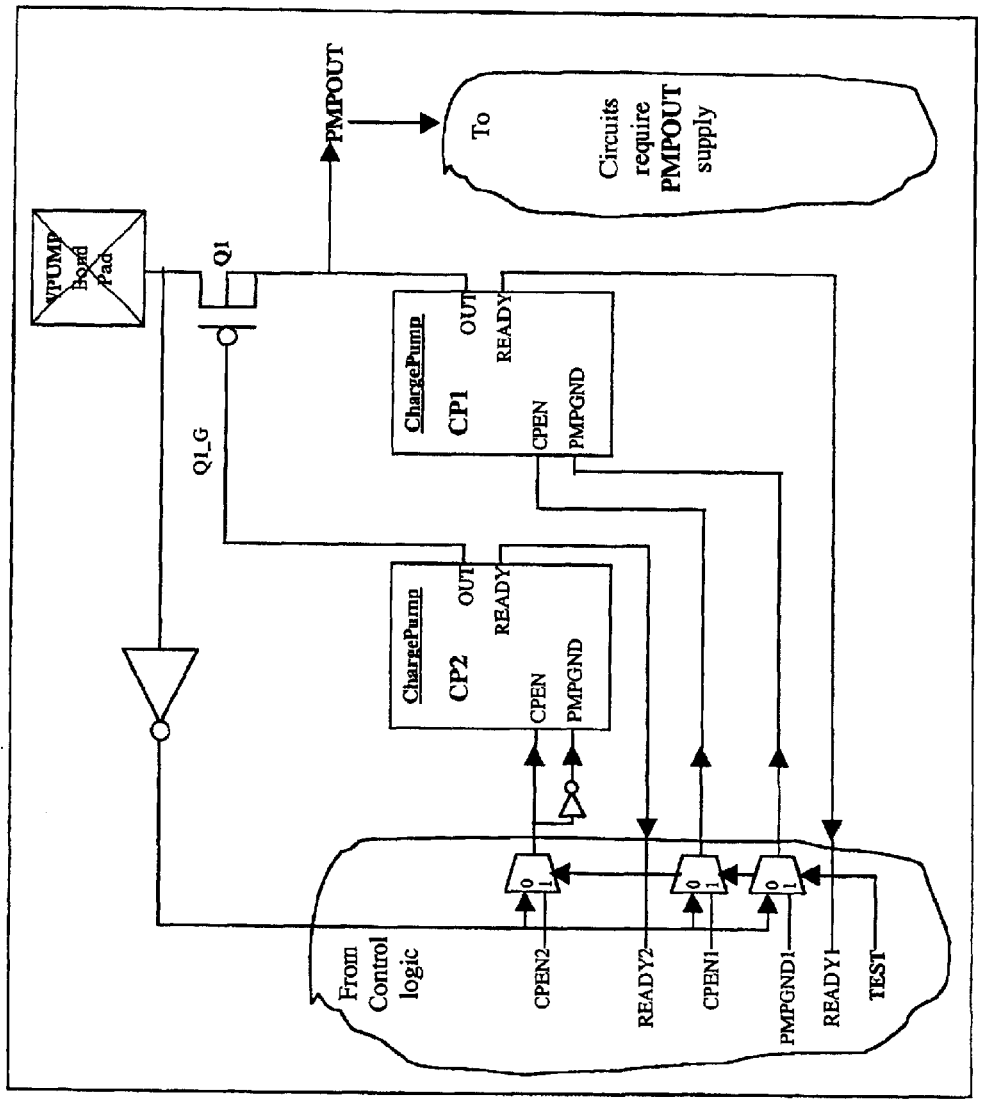
FIG. 10 is a simplified schematic illustrating another embodiment of the disclosed chargepump system.

FIG. 10 discloses another embodiment of the disclosed system. In this embodiment, the VPUMP pad is designed for controlling the selection as well as for passing Vx voltage (PUMPOUT voltage) to PMPOUT. To activate and use internal chargepump CP1, a logic "0" is applied to the VPUMP pad. To disable the chargepump and use the VPUMP pad as the source for PMPOUT, Vx is applied to the VPUMP pad.

FIG. 11 shows a truth table for the disclosed system set forth in FIG. 10. Fault free systems will produce the output values according to the truth table set forth in FIG. 11.

The full disclosures of the copending U.S. patent application is hereby incorporated into the present application by reference: U.S. patent application Ser. No. 09/654,240, filed Sep. 2, 2000, entitled "TILEABLE FIELD-PROGRAMMABLE GATE ARRAY ARCHITECTURE", and commonly assigned herewith.

The routing interconnect areas include transistor switches and memory cells at many intersections of signal lines, but not at all intersections. From this disclosure, it will be apparent to persons of ordinary skill in the art, however, that the specific number of lines in any of the routing buses may vary in accordance with the present disclosed system. Furthermore, it should be well understood that the specific number of lines in any of the signal buses may vary in accordance with the present disclosed system.

It should be understood that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. A programmable gate array comprising:
   a plurality of logic modules, each logic module having at least one output coupled to an isolation transistor, each isolation transistor in each of said plurality of logic modules having a gate;
   a first charge pump having a charge-pump enable input, a pump-voltage output coupled to said gates of each isolation transistor in each of said plurality of logic modules, and a pump-voltage-output-grounding input;
   a switching transistor coupled between said pump-voltage output of said first charge pump and an input/output pad of the programmable gate array, said switching transistor including a switching transistor gate; and
   a second charge pump having a charge pump enable input, a pump-voltage output coupled to said gate of said switching transistor, and a pump-voltage-output-grounding input; and a control circuit coupled to said charge pump enable inputs and said pump-voltage-output-grounding inputs of said first and second charge pumps.

2. The programmable gate array of claim 1, wherein:
   when said control circuit is placed in a first state, said first charge pump is disabled, said second charge pump is disabled, and the pump-voltage output of said second charge pump is grounded;
   when said control circuit is placed in a second state, said first charge pump is enabled and said second charge pump is enabled;
   when said control circuit is placed in a third state, said first charge pump is disabled and said second charge pump is enabled; and
   when said control circuit is placed in a fourth state, said first charge pump is disabled, the pump-voltage output of said first charge pump is grounded, and said second charge pump is enabled.

3. The programmable gate array of claim 2 wherein:
   when said control circuit is placed in a fifth state, said first charge pump is disabled, the pump-voltage output of said first charge pump is grounded, said second charge pump is disabled, and the pump-voltage output of said second charge pump is grounded; and
   when said control circuit is placed in a sixth state, said first charge pump is enabled, said second charge pump is disabled, and the pump-voltage output of said second charge pump is grounded.

4. A programmable gate array comprising:
   a plurality of logic modules, each logic module having at least one output coupled to an isolation transistor, each isolation transistor in each of said plurality of logic modules having a gate; and
   a first charge pump having a charge-pump enable input, a pump-voltage output coupled to said gates of each isolation transistor in each of said plurality of logic modules, and a pump-voltage-output-grounding input;
   a switching transistor coupled between said pump-voltage output of said first charge pump and an input/output pad of the programmable gate array, said switching transistor having a gate;
   a second charge pump having a charge pump enable input, a pump-voltage output coupled to said gate of said switching transistor, and a pump-voltage-output-grounding input;
   a control circuit coupled to said charge pump enable inputs and said pump-voltage-output-grounding inputs of said first and second charge pumps; and
   a signal line coupling said control circuit to a node between said input/output pad of the programmable gate array and said switching transistor.

5. The programmable gate array of claim 4 wherein:
   when said control circuit is placed in a first state said first charge pump is disabled, and said second charge pump is disabled and its pump-voltage output is grounded;
   when said control circuit is placed in a second state, said first charge pump is enabled, and said second charge pump is enabled;
   when said control circuit is placed in a third state said first charge pump is disabled and said second charge pump is enabled; and
   when said control circuit is placed in a fourth state said first charge pump is disabled and its pump-voltage output is grounded, and said second charge pump is enabled.

6. The programmable gate array of claim 4 wherein said control circuit is further configured such that:
   when said control circuit is placed in a fifth state said first charge pump is disabled and its pump-voltage output is grounded, said second charge pump is disabled and its pump-voltage output is grounded; and
   when said control circuit is placed in a sixth state said first charge pump is enabled, and said second charge pump is disabled and its pump-voltage output is grounded.

* * * * *